United States Patent [19]
Sutterlin

[11] Patent Number: 5,241,283
[45] Date of Patent: Aug. 31, 1993

[54] DRIVE AMPLIFIER FOR POWER LINE COMMUNICATIONS

[75] Inventor: Philip H. Sutterlin, San Jose, Calif.

[73] Assignee: Echelon Corporation, Palo Alto, Calif.

[21] Appl. No.: 922,580

[22] Filed: Jul. 30, 1992

[51] Int. Cl.[5] .................... H03F 3/00; H04M 11/04
[52] U.S. Cl. ............................. 330/51; 330/267; 330/296; 330/297; 330/306; 340/310 R
[58] Field of Search .............. 330/51, 267, 296, 297, 330/306; 340/310 R, 310 A

[56] References Cited

U.S. PATENT DOCUMENTS

| | | | |
|---|---|---|---|
| 4,746,897 | 5/1988 | Shuey | 340/310 R |
| 4,980,665 | 12/1990 | Schotz | 340/310 R |
| 5,057,829 | 10/1991 | Velazquez | 340/310 A X |

OTHER PUBLICATIONS

SSM10CE CEBus Compatible Spread Spectrum Powerline Modem, Intellon Corporation Copyright 1991.

Primary Examiner—James B. Mullins

[57] ABSTRACT

A power line communication amplifier circuit for providing a signal transmission across a power line medium when operating in a transmit mode, and for providing a relatively high input impedance to the power line when in a receive mode includes a unity gain buffer integrally coupled with a filter. The filter operates upon an input signal provided by a digital driver means. A control means is coupled to the digital driver means and to the buffer such that when said amplifier is switched to a receive mode, both the driver means and buffer provide a high input impedance.

22 Claims, 7 Drawing Sheets

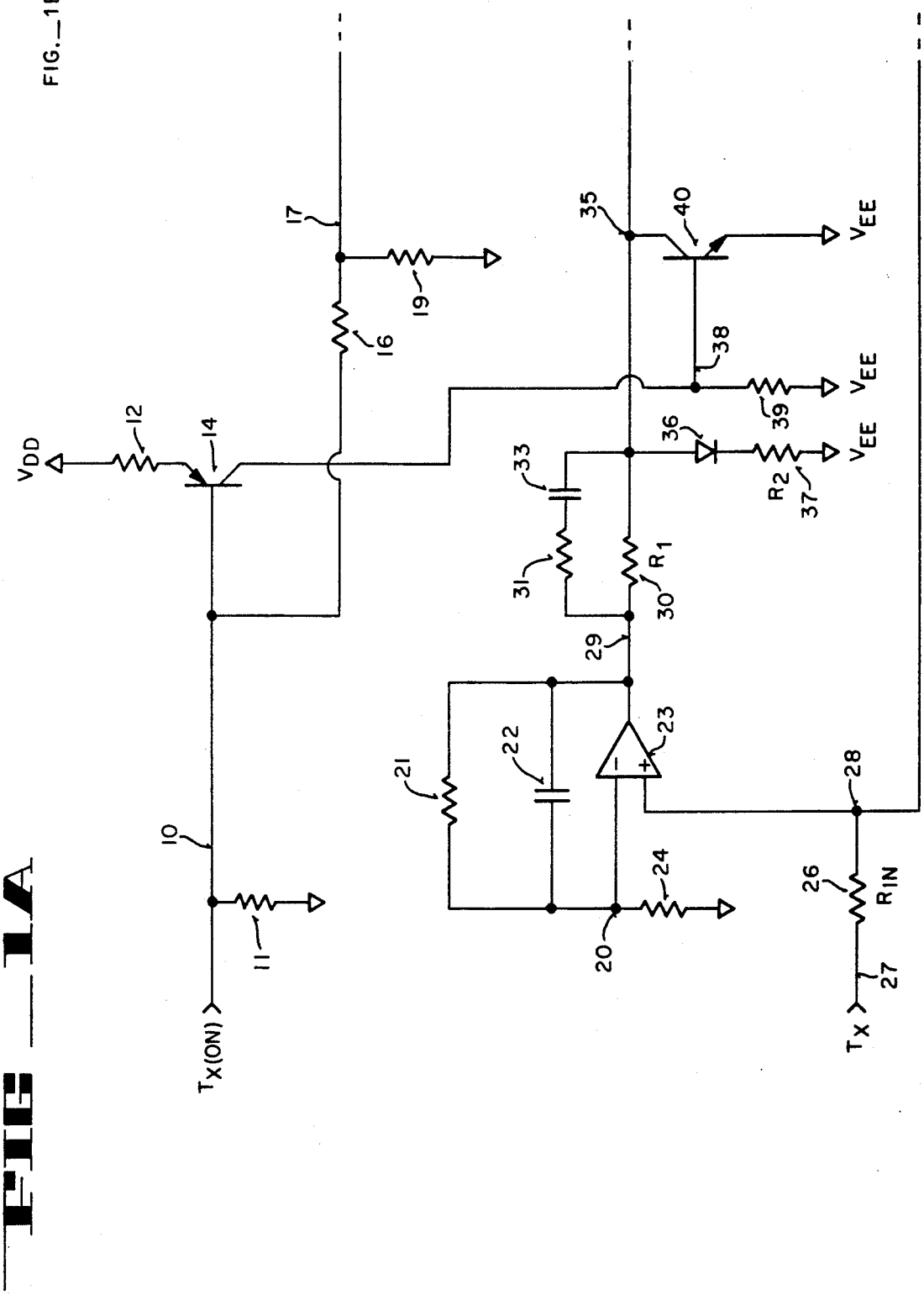

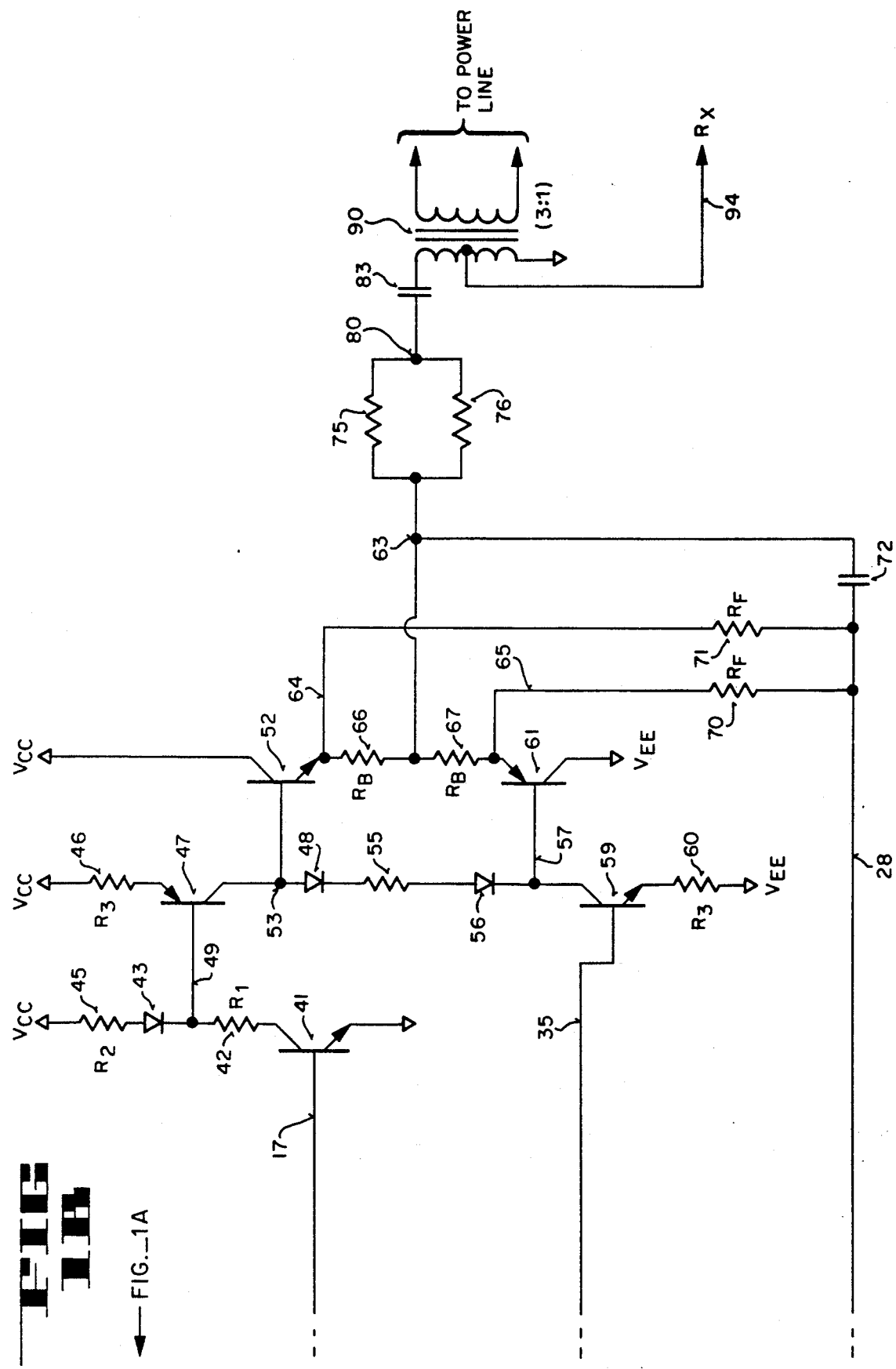

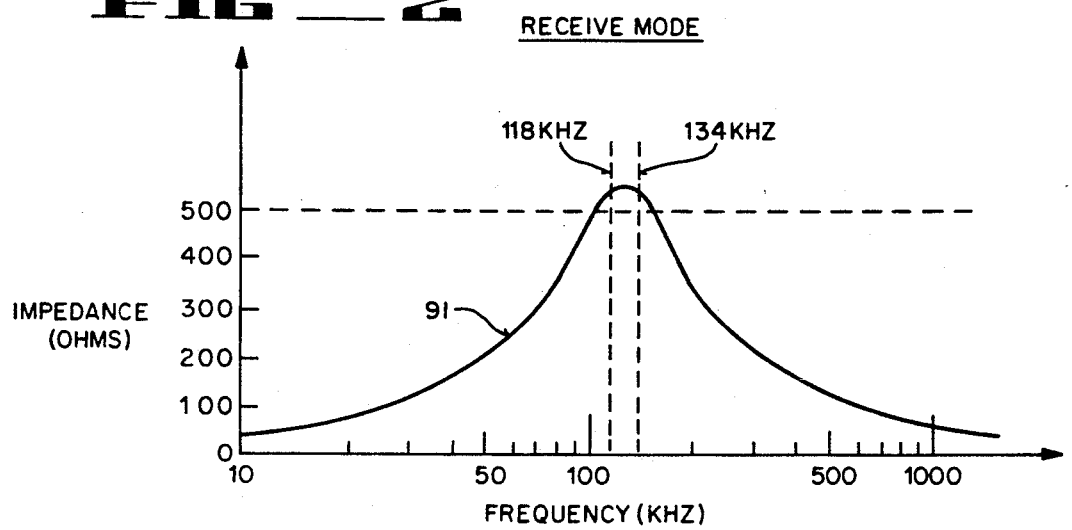
FIG_2
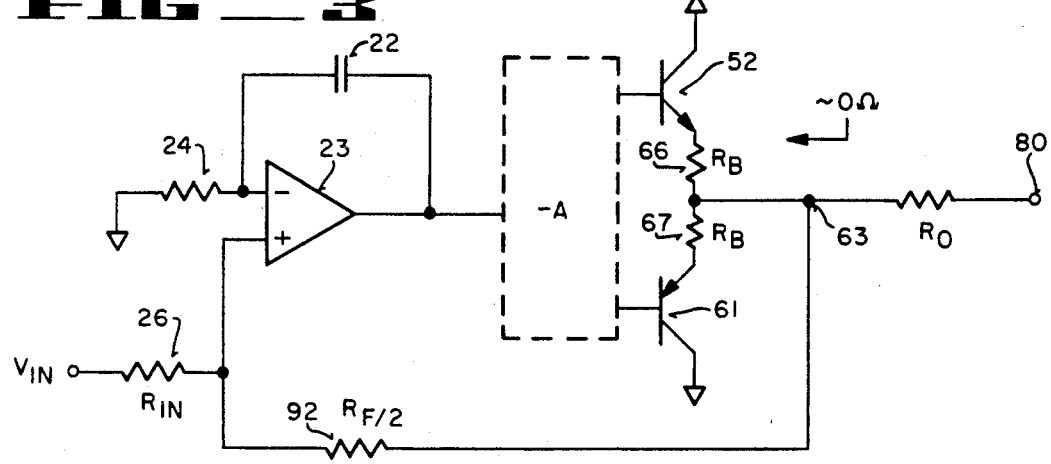
FIG_3
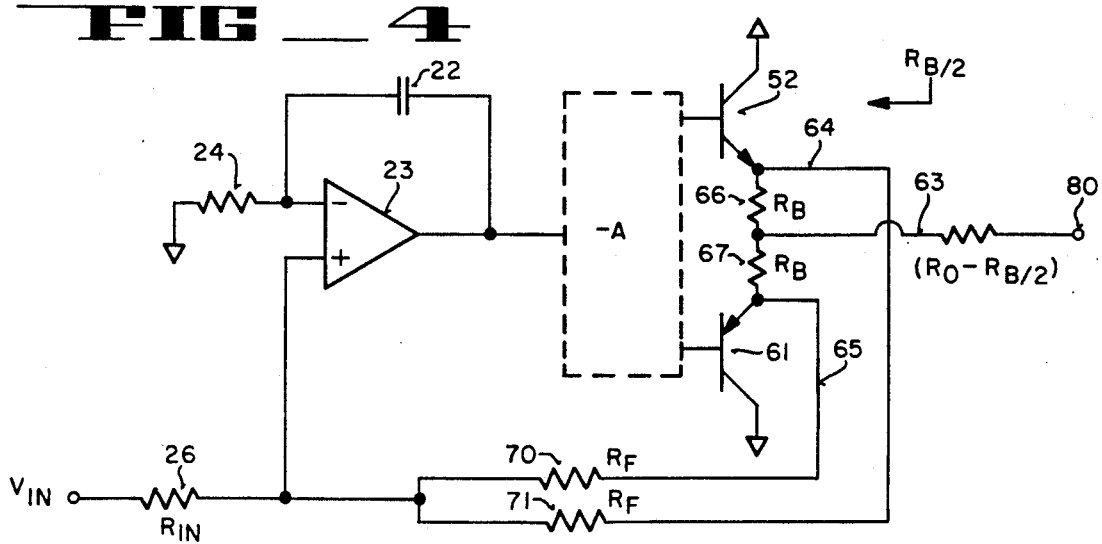
FIG_4

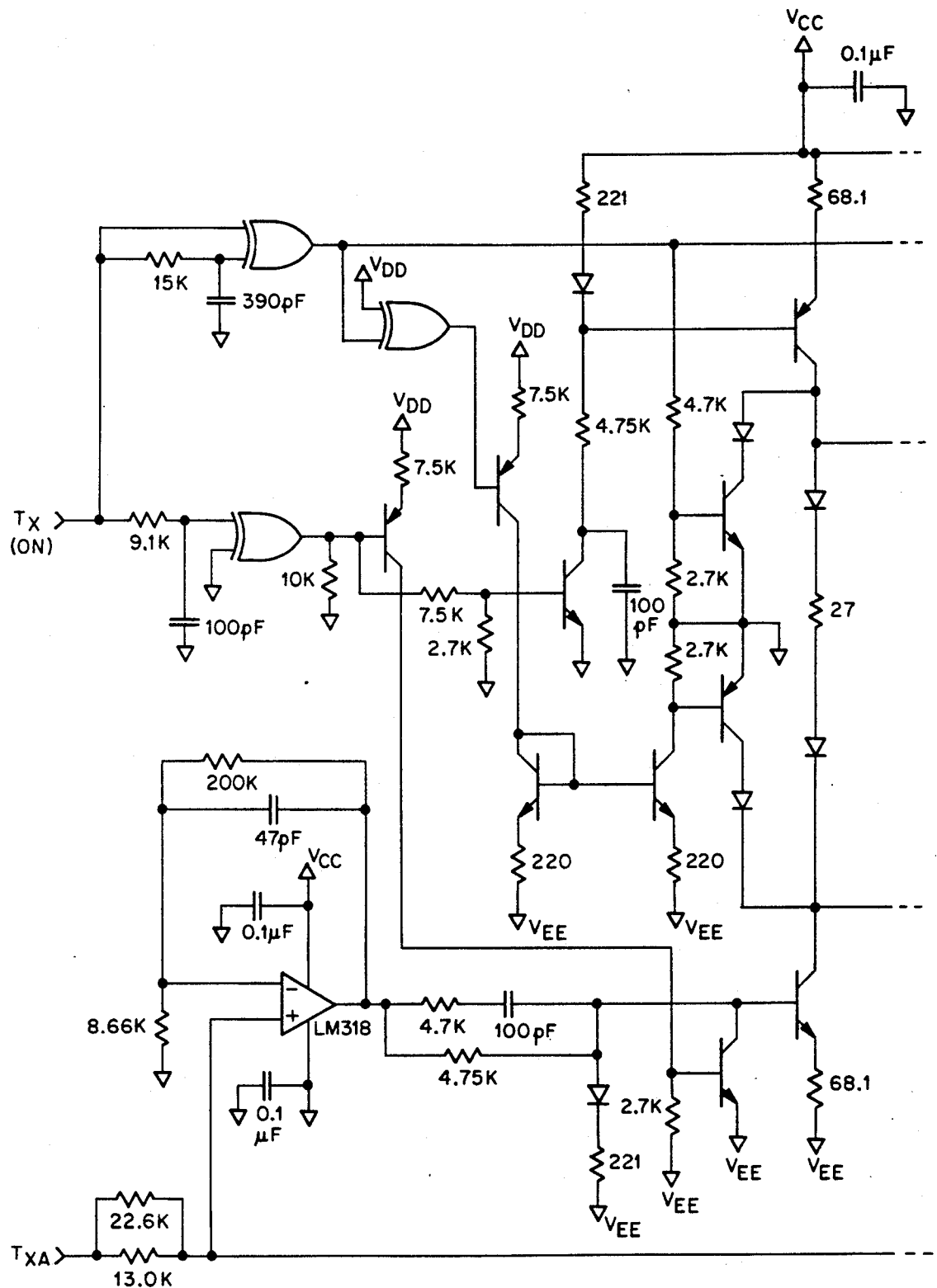
FIG. _ 5A
FIG. _ 5B →

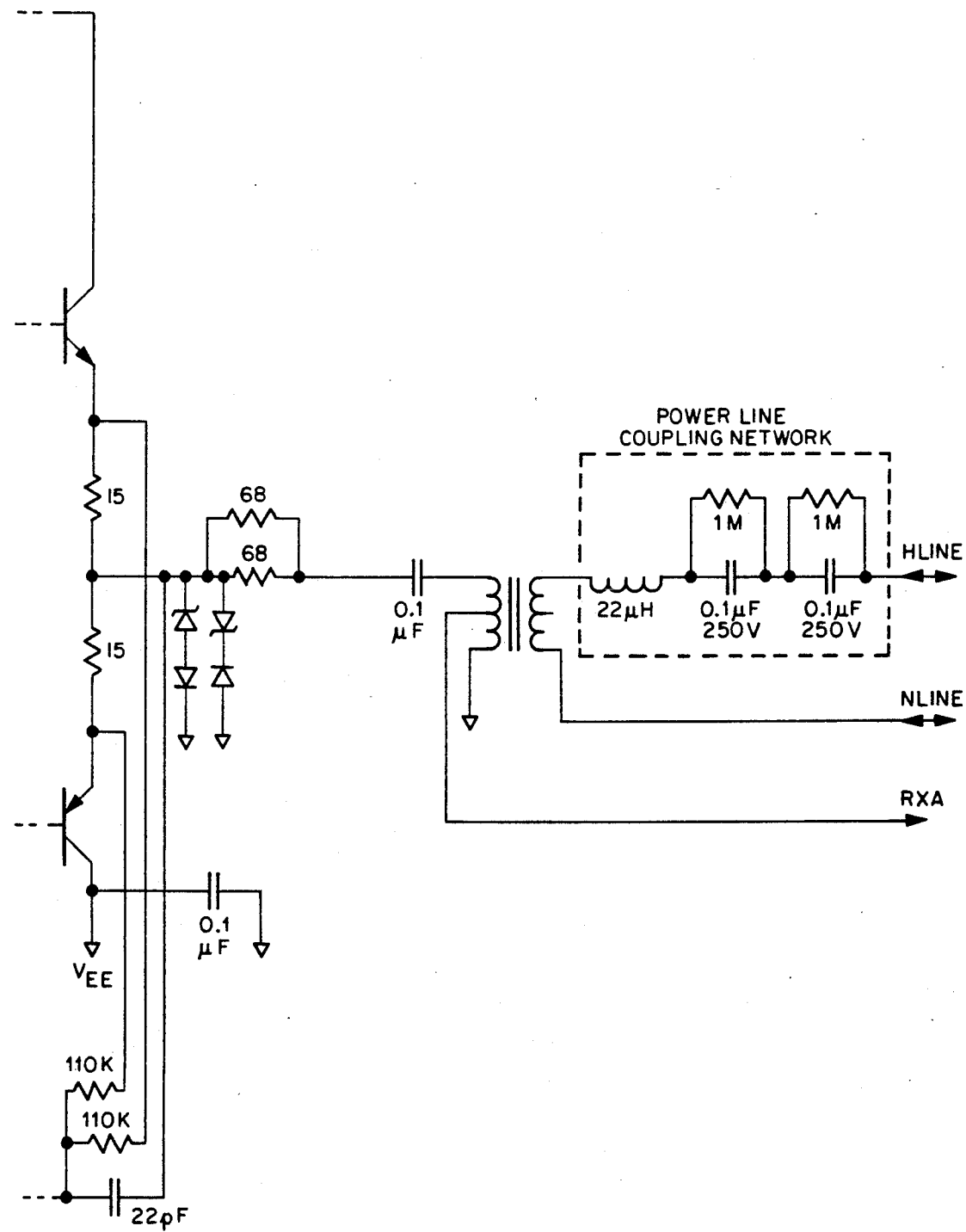
FIG._5B

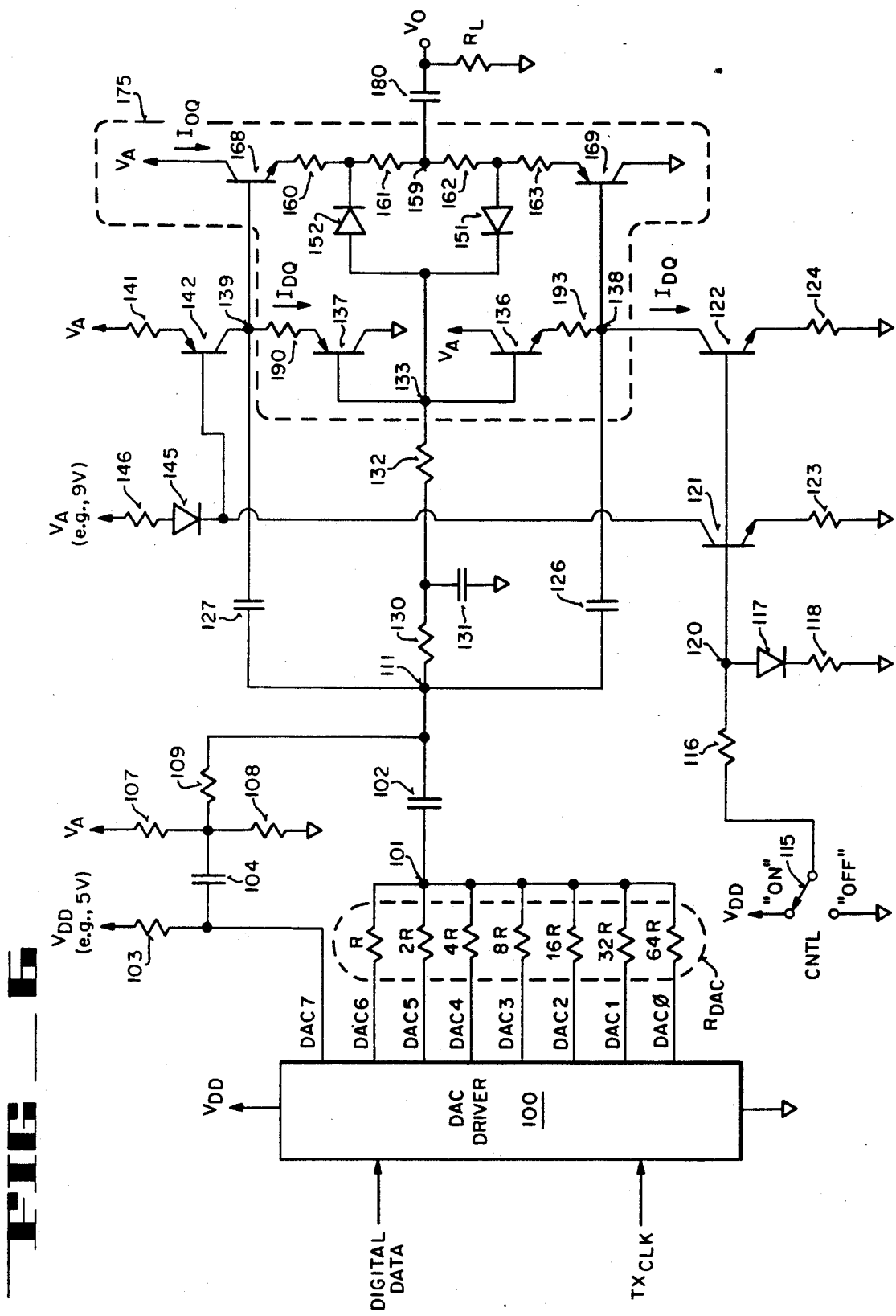
FIG_6

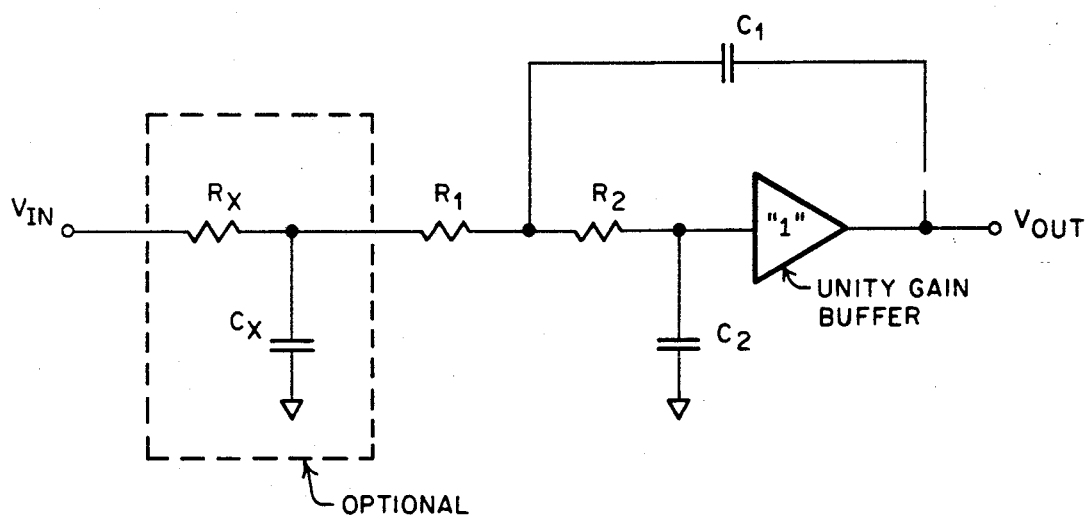
FIG _ 7

DRIVE AMPLIFIER FOR POWER LINE COMMUNICATIONS

FIELD OF THE INVENTION

The present invention relates generally to the field of amplifier circuits; more specifically, the invention relates to a class of amplifier circuits for transmitting communication signals over lines primarily used for power distribution.

BACKGROUND OF THE INVENTION

In advancing the design of communications networks, a trend is developing toward utilizing existing AC power lines as a communications medium. There is a significant advantage to the use of AC power lines for communication purposes. The installation cost for adding dedicated communication wiring and hardware to existing buildings and structures can easily exceed the cost of the system hardware itself. This provides a strong motivation to use existing power lines for communication purposes, as well as for power distribution.

In the past, there has been limited acceptance of power line communication (PLC) systems. Since power lines were never originally intended to provide a medium for communications, there are numerous problems and impairments which must be overcome in order to develop a reliable communication system utilizing existing power lines. Very often, these problems have led to inconsistent and unreliable performance in previous PLC systems.

One of the major problems which must be overcome by a PLC system is the ability to deal with the numerous noise sources and significant signal attenuation which arise in the power line environment. It is well known that most electronic and electrical products (e.g., household appliances) generate significant electrical noise which is eventually coupled back across the power lines. Attenuation of the communications signal results from the frequently lengthy connections and varying impedances seen at the receptacle points. Practitioners in the communications art have long recognized that the combination of signal attenuation plus high noise levels poses an especially difficult communication problem.

As will be seen, the present invention provides a relatively simple, low-cost drive amplifier adapted for power line communication systems. The invented amplifier circuit provides a low output impedance during transmit mode, and a high impedance looking back into the amplifier while operating in a receive mode. Special control circuitry is included to permit rapid switching between transmit and receive modes. Numerous other features desirable of a power line communications amplifier are also incorporated.

SUMMARY OF THE INVENTION

Accordingly, it is an object of the present invention to provide an improved power line communications amplifier circuit which provides a low output impedance in the transmission band during signal transmission, and a high input impedance while in a receive mode.

It is another object of the present invention to provide an amplifier circuit for power line communication systems which provides for a relatively large output voltage swing even when driving a very low receptacle impedance.

It is yet another object of the present invention to provide a stable amplifier circuit for power line communications which withstands oscillation even when driving widely varying receptacle impedances.

It is still another object of the present invention to provide an amplifier circuit for power line communications exhibiting low harmonic distortion.

It is a further object of the present invention to provide an amplifier circuit which is compatible with input and control circuitry powered from a integrated circuit operating off a standard power supply.

It is a further object of the present invention to provide an amplifier circuit for power line communications which is capable of switching between transmit and receive modes very quickly to reduce the potential for signal collisions on the line.

It is yet another object of the present invention to provide an amplifier circuit which complies with FCC regulations governing power line communications.

It is still a further object of the present invention to provide an amplifier circuit incorporating all of the above features at a low cost.

In accordance with one embodiment of the present invention, the amplifier circuit includes a driver means for providing a communications signal as a transmit signal. The transmit signal is coupled to a filter means for filtering the signal to eliminate frequency components at a predetermined frequency or frequency range. A buffer means then transmits the filtered transmit signal onto the power line medium through a coupling circuit. The coupling circuit couples the signal onto the powerline while preventing power distribution frequencies from being passed back to the amplifier.

A control means coupled to the buffer means and driver means provides switching from the transmit mode of operation to receive mode of operation. When switched in a receive mode of operation, the buffer means and the driver means present a relatively high impedance to the power line.

One of the central features of the present invention is that all of the elements of the amplifier circuit are combined in such a way as to provide high power driving capability when transmitting, and a relatively high input impedance when in a receive mode of operation, all at a minimal device count and cost.

BRIEF DESCRIPTION OF THE DRAWINGS

The present invention will be understood more fully from the detailed description given below and from the accompanying drawings of the preferred embodiment of the invention, which, however, should not be taken to limit the invention to the specific embodiments shown, but are for explanation and understanding only.

FIGS. 1A and 1B show a circuit schematic diagram of one embodiment of the drive amplifier of the present invention.

FIG. 2 is a plot illustrating the output impedance of the amplifier of FIG. 1 (operating in receive mode) as a function of frequency.

FIG. 3 is a simplified circuit schematic of the amplifier of FIG. 1 showing an alternative feedback configuration.

FIG. 4 is a simplified circuit schematic of the amplifier FIG. 1 illustrating the advantage of the feedback configuration.

FIGS. 5A and 5B show a detailed circuit schematic implementation of the amplifier of FIG. 1.

FIG. 6 is an alternative embodiment of the drive amplifier of the present invention.

FIG. 7 illustrates the basic filter topology incorporated within the amplifier of FIG. 6.

DETAILED DESCRIPTION

An amplifier circuit for driving communication signals onto a power line medium is described. In the following description, numerous specific details are set forth in order to provide a thorough understanding of the invention. It will be obvious, however, to one skilled in the art that the present invention may be practiced without these specific details. In other instances, well known circuits, structures, etc., have not been shown in detail in order avoid unnecessarily obscuring the present invention.

Referring to FIGS. 1A and 1B, there is shown a circuit schematic diagram of the amplifier circuit of the present invention. In transmit mode, the communications signal is applied to node 27. From there, it is coupled through resistor 26 to the positive input terminal of operational amplifier (op amp) 23, i.e., node 28. Phase compensation and gain for op amp 23 are set by resistor 24, coupled between the negative input terminal of operational amplifier 23 (i.e., node 20) and ground, and also by means of the parallel combination of resistor 21 and capacitor 22 coupled between nodes 29 and 20. Additional phase compensation is provided by the network comprising the series combination of resistor 31 and capacitor 33 coupled across nodes 29 and 35 in parallel with resistor 30.

FIGS. 1A and 1B also show diode 36 and resistor 37 being coupled in series between node 35 and the negative supply potential, $V_{EE}$. Node 35 is also coupled to the collector of NPN bipolar transistor 40. The emitter of transistor 40 is coupled directly to $V_{EE}$ while the base of transistor 40, i.e., node 38, is coupled to $V_{EE}$ through resistor 39. Node 35 is also coupled to the base of NPN bipolar transistor 59. Together, diode 36 and transistor 59 function as a current mirror, with resistor 30 ($R_1$) acting as the input resistor to the mirror. Resistor 37 ($R_2$) and resistor 60 ($R_3$), coupled from the emitter of transistor 59 to $V_{EE}$, establish the current ratio between the input and output of the mirror. Thus, this ratio sets the voltage gain from node 29 to node 57 in conjunction with the ratio of current mirror load impedance (i.e., the AC equivalent load on the collector of transistor 59) to the current mirror's total input impedance (i.e., resistor 30 in parallel with the series combination of resistor 30 and capacitor 31). This aspect of the present invention will be discussed in further detail shortly.

FIGS. 1A and 1B also show a transmit/receive control signal, $T_{X(ON)}$, being applied to the base of PNP transistor 14 at node 10. The emitter of PNP transistor 14 is coupled to positive supply potential $V_{DD}$ through resistor 12 while the collector of transistor 14 is coupled to the base of transistor 40 at node 38. The base of bipolar transistor 14 is also coupled to the base of transistor 41 through resistor 16. Note that nodes 10 and 17 have a path to ground provided for them through respective resistors 11 and 19.

NPN bipolar transistor 41 is shown having its emitter grounded and its collector coupled to the base of PNP transistor 47 at node 49 through resistor 42. The series combination of resistor 45 and diode 43 connect the positive supply potential $V_{CC}$ to the base of transistor 47 at node 49. The emitter of transistor 47 is coupled to $V_{CC}$ through resistor 46. It should be apparent that the combination of diode 43, transistor 47 and resistors 42, 45 and 46 form a current mirror in the same way described above. As before, the ratio of resistors 45 and 46 establishes the current ratio between the input and output of the mirror.

Notice that the values of resistors 42 (R1), 45 (R2) and 46 (R3) are the same as those of resistors 30, 37 and 60, respectively. This means that the DC current of the upper current mirror, supplying the drive current for NPN transistor 52, matches the DC current of the lower current mirror, which supplies base drive current for PNP transistor 61. Because both current mirrors drive their respective halves of the output stage (comprising transistors 52 and 61) the circuit is balanced with respect to op amp 23 (providing of course that transistor 41 is on, i.e., $T_{X(ON)}$ is high).

Continuing with the description of the circuit, NPN transistor 52 is connected to the collector of transistor 47 at node 53. The base of transistor 52 is also coupled to the base of PNP transistor 61 through the series connection of diode 48, resistor 55 and diode 56. The emitters of transistors 52 and 61 are coupled through biasing resistors 66 and 67.

It is appreciated that transistors 52 and 61 are arranged in a push-pull configuration wherein the collectors of transistors 52 and 61 are coupled to supply potentials $V_{CC}$ and $V_{EE}$, respectively. Since the current mirrors driving transistors 52 and 61 are balanced, this means that the push-pull output stage is itself balanced. That is, if op amp 23 outputs zero volts at node 29, then the output at node 63 will also be zero. A positive output from op amp 23 causes more drive current to be drawn from transistor 61 relative to t. ansistor 52 so that node 63 becomes more negative. Similarly, if op amp 23 produces a negative output, transistor 52 will receive more base current compared to transistor 61, and node 63 will become more positive.

Feedback is provided for in the circuit of FIGS. 1A and 1B by means of resistors 70 and 71 and also capacitor 72. Resistor 71 is connected between the emitter of transistor 52 (node 64) and the positive input terminal of operational amplifier 23. Likewise, the emitter of PNP transistor 61 is also coupled to node 28 through resistor 70. Resistor 70 is coupled between nodes 65 and node 28. Capacitor 72 is shown being connected across nodes 63 and 28.

Recognize that transistor 59 provides voltage gain for the amplifier circuit at the same time that the push-pull output stage provides current gain. Both of these stages operate to drive a communications signal across a pair of resistors 75 and 76. Resistors 75 and 76 are coupled in parallel across nodes 63 and 80. Node 80 is coupled to one winding of transformer 90 through AC coupling capacitor 83. Transformer 90 provides an interface between the driving amplifier circuit of the present invention and the power lines. Transformer 90 is shown having a 3:1 turns ratio.

Practitioners familiar with PLC systems will realize that in certain situations, signal attenuation can be minimized by the use of various power line coupling networks. When used in conjunction with the present invention, such a coupling network would be connected on the line side of transformer 90. A coupling circuit for use in PLC systems is described in a co-pending application entitled, "Power Line Coupling Network", Ser.

No. 07/698,618; filed May 10, 1991, which application is assigned to the assignee of the present invention.

Having thus far described the various connections and devices utilized in the amplifier circuit of FIGS. 1A and 1B, a discussion of various operating principles and advantages of the present invention may now be presented.

One of the important features of the present invention is its ability to transmit a communications signal at the carrier frequency with a low output impedance (e.g., less than 10 ohms). In transmit mode, a very low output impedance is desired in order to overcome the very low impedance of electrical appliances connected to the line. For example, in one embodiment, transmissions take place at carrier frequencies of 118 kilohertz and 134 kilohertz.

Not only must the driving amplifier provide a low impedance in transmit mode, but it also must provide a relatively high output impedance (greater than 500 ohms) at the carrier frequencies while in a receive mode. One can imagine that if a great many amplifiers were connected to a common power line, and if each had a low output impedance in its receive mode, then the collective load impedance as seen by a transmitting source would be so low as to make it prohibitively difficult to transmit a signal onto the line. As discussed further below, the present invention achieves a relatively high output impedance in receive mode and a relatively low the line. As discussed further below, the present invention achieves a relatively high output impedance in receive mode and a relatively low impedance in transmit mode. Moreover, the invention is capable of rapidly switching between the transmit and receive mode with corresponding switching of input impedance levels as seen from the power line. This latter ability is critical for maximizing communications throughout while minimizing signal collisions on the power lines.

During normal transmitting operations, the transmit signal is applied to the positive input terminal of operational amplifier 23 via node 27. The amplified transmit signal appears at node 29. This signal is then coupled to node 35 at the base of NPN bipolar transistor 59. As discussed above, transistor 59 provides voltage gain for the signal as it is delivered to the output stage.

It is significant to note that the portion of the circuit represented in FIG. 1B is powered by the supply potential $V_{CC}$, which, by way of example, represents a relatively high positive potential of approximately +12 volts ($V_{EE}=-12$ V). At the same time, the portion of the circuit represented in FIG. 1A is powered by $V_{DD}$ (e.g., 5 V). Thus, the relatively small amplitude signal output by amplifier 23 eventually is gained up to a larger amplitude signal by transistor 59. This larger signal is output onto the line by the push-pull output stage comprising transistors 52 and 61. This stage provides current gain for the output amplifier signal.

Whenever a communication signal is being transmitted onto the power line medium, the transmit control signal, $T_{X(ON)}$, is raised to a high logic level (e.g., 5 volts). A high potential at node 10 turns off transistor 14. At the same time, transistor 40 is also turned off—its base-emitter junction being shunted by resistor 39. Turning off transistor 40 allows the voltage at node 35 to swing freely.

With $T_{X(ON)}$ raised to 5 volts, a high potential also appears at node 17, thereby providing drive current to the base of transistor 41. Because transistor 41 is on, current flows through resistors 45, 42 and diode 43. The resulting voltage drop at node 49 turns on PNP transistor 47 which, in turn, provides a source of base current to activate the push-pull output stage comprising transistors 52 and 61 as explained earlier.

Diodes 48 and 56, together with resistor 55, insure that an adequate voltage separation is maintained between nodes 53 and 57 so that at least one of the two transistors 52 and 61 are operating in the linear or active region at all times. During transmission the output impedance appearing at node 63 is kept to a minimum by means of the negative feedback provided to operational amplifier 23 through resistors 71 and 70. Basically, the output impedance of the amplifier is reduced inversely proportional to the loop gain of the amplifier and the feedback circuit.

The circuit is switched to a receive mode by taking the transmit control signal to a low logic level (e.g., ground). Grounding node 10 activates PNP transistor 14. With PNP transistor 14 on, drive current is supplied to the base of NPN transistor 40. This turns transistor 40 on, thereby pulling node 35 down to negative supply potential $V_{EE}$, which turns off NPN transistor 59.

Referring now to the upper half of the amplifier circuit, a ground potential on node 10 also grounds node 17. This turns off transistor 41 which causes a high potential at node 49 turning off transistor 47. With transistors 47 and 59 both off, the push-pull output stage comprising transistors 52 and 61 are disabled, i.e., the transistors have no drive current. Disabling the push-pull output stage results in a high output impedance at node 64 and 65. Hence, grounding the control signal $T_{X(ON)}$ causes the amplifying portion of the circuit of FIGS. 1A and 1B to switch to a high impedance state. In this state the received communication signal is simply tapped off of the amplifier side of transformer 90 (node 94).

As previously discussed, the invented amplifier is capable of switching between transmit and receive modes of operation very quickly—with typical speeds on the order of 15 microseconds. The ability to rapidly switch between one mode of operation and the other is crucial to the avoidance of collisions between signals on the power line medium. As the switching delay gets larger, the probability of incurring collisions increases dramatically. For example, according the CSMA protocol, a node sensing carrier holds its transmission until it detects a quiet line; however, if the drive amplifier takes an inordinate amount of time to settle, then it takes that much longer for the other nodes to become aware of another transmission.

To achieve fast switching, several important circuit features have been incorporated in the present invention. First of all, providing an input node which can be driven digitally by standard logic devices is important in providing a control element for switching operations. All of the components shown in FIG. 1A can be easily integrated into a single semiconductor circuit using conventional bipolar complimentary metal-oxide-semiconductor (BiCMOS) process technology. Alternatively, a conventional CMOS process can be used with appropriate substitution of transistors 14, 40 and diode 36. This means that the switching circuitry of the amplifier is easily interfaced to the switching control signal $T_{X(ON)}$. Moreover, when the circuit portion illustrated in FIG. 1A is fabricated as an integrated circuit, all the control and input circuitry can be powered off of a common 5 volt power supply.

It should be understood that when the circuit portion of FIG. 1A is fabricated as an integrated circuit, that there will be a corresponding shift in supply voltages. For example, one possibility is $V_{DD}=5$ volts, $V_{EE}=0V$ and $V_{CC}=+24V$. Furthermore, it is appreciated that some resistor values may need to be adjusted (e.g., resistors 42, 45 and 46) to accommodate this shift in supply voltage.

Secondly, the values of resistors 11, 12 and 39 are chosen to insure that transistor 14 always operates in a mode where it is either functions as a current source or it is completely turned off. Transistor 14 is deliberately kept out of saturation so that node 38 can be switched quickly from a high to a low voltage level. Furthermore, the presence of resistor 11 allows rapid discharge of the base voltage of transistor 14 during a high to low transition of node 10. Correspondingly, the presence of resistor 39 helps in the rapid discharge of the voltage at node 38 to turn off transistor 40. Resistor 19 performs the same function to discharge node 17, coupled to the base of transistor 41, when the control signal $T_{X(ON)}$ transitions from a high to a low level. Altogether, the DC biasing keeping transistor 14 out of saturation and the inclusion of resistors 11, 19 and 39 facilitate rapid switching between modes.

One of the difficulties in designing an amplifier circuit for driving power line communications is the fact that government regulations limit the amount of power that may be broadcast at certain frequencies. According to the present invention, the power delivered to the line is kept relatively high without harmonic levels which would exceed government regulation limits. This is accomplished by means of transistor 59 and push-pull transistors 52 and 61, and the configuration wherein the relatively small output of op amp 23 is stepped up to a larger signal. As explained previously, transistor 59 provides voltage gain while current gain is provided by the push-pull combination. At present, the output stage of the invented amplifier circuit is capable of delivering about 40 milliamps with a communications signal of 18 volts peak-to-peak at node 63.

Recognize that the operating supply potential of the output driver stage illustrated in FIG. 1B is currently maintained at approximately 24 volts (e.g., ±12 V). Because of the relatively large currents and voltages which must be withstood by the components of FIG. 1B, each of the component elements illustrated in FIG. 1B is implemented as a discrete device. The combination of higher voltage discrete transistors (represented by the components of FIG. 1B) driven by an integrated circuit providing mode switching and signal amplification, minimizes the total cost of the entire circuit. The operational amplifier and switching portions of the circuit may be implemented on an integrated circuit as will be discussed further. Meanwhile, the high-powered output portion is optimally manufactured at a discrete level. Taking this manufacturing approach, the total cost of the circuit of FIGS. 1A and 1B is kept to a minimum.

Another advantage of the present invention is its ability to operate off of very small current (tens of milliamps) from the power supply, even under worse case conditions. Drawing such a small amount of current from the power supply allows the present invention to utilize a capacitive input power supply. A capacitive input power supply is well known to power supply designers as a low cost supply. The prohibitive factor associated with the capacitive input type of power supply is that it is limited in the amount of current it can deliver before the capacitor size and cost make them impractical (generally not exceeding 50 milliamps). However, it compensates for this fact by its ability to generate higher voltages which translate into high power output (recall that power is equal to the product of voltage times current). By minimizing the current drawn from its supplies, the present invention is able to benefit from the use of a capacitive input type of power supply. That is, the present invention relies upon a relatively large operating supply potential (e.g., 24 volts) compensated by a relatively low supply current (approximately 40 milliamps), to achieve maximum power output.

This result is accomplished by means of the large voltage gain provided by transistor 59 coupled with the large current gain of the output stage, and by the 3:1 turns ration associated with transformer 90. It is appreciated that transformers not only transform impedance but they also modify voltage levels. By way of example, for transformer 90 of FIG. 1B, the voltage level on the amplifier side is nominally three times larger than the voltage level present on the line side. But at the same time, the transformer provides three times the current drive capability on the line side, with the benefit of smaller supply currents on the amplifier side. The present invention employs large operating supply potentials at the output stage in combination with the 3:1 turns ration of transformer 90 to transform the high voltage associated with the amplifier side of the coil into a low voltage on the line side. (Obviously, other turns ratios may be used with similar results.)

On the other hand, current draw from the amplifier's power supply is minimized by means of the 3:1 turns ratio. That is, the current drive capability on the line side is three times greater than the current drawn from the power supply on the amplifier side of transformer 90. The low power supply currents then allow the use of the inexpensive capacitive input type of power supply.

Because an amplifier driving a power line communications system experiences widely varying receptacle impedances, assurances must be taken to prevent oscillations from occurring. This is often a difficult challenge in amplifier design. To provide stability against oscillations, the present invention incorporates lead/lag compensation networks coupled to op amp 23. The lead compensation network circuitry comprises resistor 31 and capacitor 33 coupled in series between nodes 35 and 29. Lag compensation is provided by the feedback network comprising resistors 21, 24 and capacitor 22. At the frequency where the gain of the amplifier plus the gain or loss of the feedback network is unity, the lead and lag compensation networks guarantee at least 45° of phase margin.

FIG. 2 illustrates the input impedance looking in from the power line of the circuit as a function of frequency. By way of example, operating frequencies of 118 kilohertz and 134 kilohertz are shown being utilized for a particular embodiment. The impedance is depicted by waveform 91. The lower impedance at frequencies below 118 kilohertz is primarily due to the magnetizing inductance of transformer 90. At frequencies above 134 kilohertz, the low impedance is due to the presence of parasitic capacitance.

One of the reasons why the amplifier circuit of the present invention is useful in driving power line communication systems is that it achieves a very low harmonic distortion. Basically, FCC Class B government regulations prohibit conducting more than 1000 microvolts of noise across any portion of the AM broadcast band. Emissions tests are performed to meet these regulations by use of a network which results in approximately 100 ohms across the hot and neutral power lines in the pertinent frequency range. The power lines are then measured to determine how much noise is being passed onto the lines. Because of the operating frequencies involved (e.g., 118 KHz and 134 KHz), there is a potential for a fifth harmonic to fall within the AM broadcast band.

Low harmonic distortion is attained in the present invention by enclosing the entire amplifier circuit—not only just the operational amplifier itself, but the operational amplifier as well as the output buffer circuitry—within the feedback loop. In other words, the feedback connection back to the positive input of operational amplifier 23 is taken from the output node of the amplifier driver circuit at node 63. This feedback path from node 63 to node 28 includes resistors 66, 67, 70, 71 and capacitor 72. The fact that the feedback connection is around the whole amplifier—including the output buffers, instead of simply operational amplifier 23 alone—means that the present invention realizes distortion levels of better than 68 dB below the fundamental when driving a 100 ohm resistive load.

Furthermore, amplitude distortion (i.e., signal clipping) is similarly avoided when driving low receptacle impedances on the order of 1 ohm. Consider the simplified alternative embodiment shown by the circuit diagram of FIG. 3. Rather than employing separate resistors 70 and 71 coupled to the emitters of transistors 61 and 52, respectively, the schematic of FIG. 3 shows the feedback resistors merged into a single equivalent resistance 92 connected to node 63. With this type of feedback, the open loop output impedance of the amplifier is approximately $R_B/2$. (Note that the purpose of resistors 66 and 67 is to provide a stable DC quiescent current for the two output transistors 52 and 61). With the loop closed, the output impedance looking into node 63 is approximately 0 ohms. The equivalent resistance between node 63 and 80 is shown in FIG. 3 by resistor $R_O$.

One possible problem with the alternative feedback scheme of FIG. 3 is that when the output stage has to drive a very small load impedance (one ohm or less) a significant amount of extra current is generated. This extra current drops additional voltage across resistors 66 and 67 which limits the voltage clipping level at node 63. In other words, the peak-to-peak voltage swing of the signal appearing at output node 63 must be reduced to avoid incurring amplitude distortion. The consequence of this extra drop means that less power is delivered onto the communication lines.

Contrast the alternative embodiment of FIG. 3 with the embodiment shown in FIG. 4, once again in simplified form. Instead of making the feedback connection directly to node 63, the embodiment shown in FIG. 4 has feedback connections to nodes 64 and 65; that is; directly to the emitters of the output devices. Also, the single feedback resistor of FIG. 3 is shown being split into a pair of feedback resistors 70 and 71. By splitting the feedback resistor into two separate resistors and coupling them directly to the emitters, the amplifier is able to reduce the value of the resistance of $R_O$ by $R_B/2$ for the same output impedance seen looking in from the power line.

This result is significant since it allows the resistance value between nodes 63 and 80 to be reduced in value. So in effect, a portion of the previous resistance $R_O$ has now been embedded into the amplifier. The net result is that an additional 2 dB of output signal range is achieved before clipping occurs. In other words, the key difference between the schematics of FIGS. 3 and 4 is that in FIG. 4, the series output resistor between node 63 and 80 can be made smaller by $R_B/2$ to provide extra signal headroom. It is appreciated that the resistance $R_O$, i.e., resistors 75 and 76 as shown in FIG. 1B, is required to keep the amplifier operating in a linear mode when presented with a very low impedance on the line. Linear operation guards against voltage or current clipping.

FIGS. 5A and 5B are a detailed circuit schematic diagram showing one implementation of the present invention including specific component types and values. Note that the circuit of FIGS. 5A and 5B includes several EXCLUSIVE-OR logic gates together with extra associated circuitry. Practitioners in the art will appreciate that the purpose and function of this circuitry is to eliminate possible glitches which might occur while switching from transmit to receive mode and vice-a-versa. Of course, certain embodiments and applications may not require such circuitry, or may employ other components for similar reasons. This additional circuitry is not deemed to be essential to the present invention.

An alternative solution to the problem of driving communications signals onto power lines is provided by the circuit schematic of FIG. 6. Like the previous embodiments, the amplifier of FIG. 6 provides a means for presenting a high impedance to the power line while operating in a receive mode. On the other hand, when transmitting, the amplifier is characterized by a very low output impedance. In addition, digital control circuitry is provided to facilitate rapid switching between transmit and receive modes of operation.

To begin with, the amplifier of FIG. 6 has an output stage which comprises a unity gain buffer 175 coupled between a supply voltage $V_A$ (e.g., 9 volts) and ground. Buffer 175 provides an output signal at node 159 which is then coupled through capacitor 180 to a suitable power line coupling circuit. For ease of understanding, the amplifiers' output signal $V_O$ is shown across a load resistance $R_L$ which represents the equivalent impedance of the coupling circuit and the power line.

Unity gain buffer 175 includes a pair of up/down transistors configured to provide large amounts of current into output node 159. At the same time, this configuration produces a relatively high impedance looking back into the amplifier from the power line when switch 115 is in the "off" position. The up/down configuration in the top half of buffer 175 comprises the combination of PNP transistor 137 and NPN transistor 168. Both of these transistors are configured as emitter followers, with the emitter of transistor 137 (through resistor 190) and the base of transistor 168 both being coupled to node 139. The emitter of transistor 168 is coupled through series resistors 160 and 161 to output node 159. These resistors have relatively small resistance values so that the signal voltage drop across them is negligible. This means that the potential at node 133 (coupled to the base of transistor 137) is essentially the same as the potential produced at node 159 during normal transmit operations.

Similarly, NPN transistor 136 has its base coupled to node 133 and its emitter coupled to node 138 (through resistor 193). Node 138 is coupled to the base of PNP transistor 169, which has its emitter coupled to output node 159 through series resistors 162 and 163. Transistors 142 and 122—together with resistors 141 and 124—provide a source of current for driving buffer 175.

Altogether, components 115-124 and 141-146 comprise a biasing network coupled to unity gain buffer 175. When digital switch 115 (which may comprise an ordinary field-effect digital gate) is in its "on" position, supply potential $V_{DD}$ is coupled to node 120 through resistor 116. This establishes a reference voltage on the bases of transistors 121 and 122. Collectively, devices 116-124 act as a current mirror supplying bias current to transistor 136 and the other current mirror comprising devices 141-146, which in turn provide bias current to transistor 137. Devices 141, 142 and 145, 146 function as a current mirror such that a constant current is provided for transistors 136 and 137. Thus, with switch 115 in its "on" position, unity gain buffer 175 is activated.

In the opposite case, when switch 115 is in its "off" position, node 120 is grounded. This turns off transistors 121 and 122 and also transistor 142. The result is that no drive current is available for buffer 175 and the emitter follower configuration of the up/down transistor pairs simply presents a high impedance to the power line. Practitioners in the art will appreciate that with switch 115 "off", the unity gain buffer configuration shown in FIG. 6 presents a very high impedance looking back into node 159 (ignoring diodes 151 and 152 for the time being). This up/down configuration also provides high current driving capability so that the invented circuit is capable of transmitting a signal of approximately several hundred milliwatts of power.

Diodes 151 and 152 are incorporated into the basic buffer circuit of FIG. 6 in order to prevent high currents from destructively breaking down the output stage transistors. During its receive mode of operation, the amplifier of FIG. 6 must be capable of withstanding unattenuated signal voltage swings which appear on the power line. These voltage swings could possibly destroy the output stage transistors by means of high reverse base/emitter breakdown current. To guard against this possibility, diodes 151 and 152 are included.

During normal transmit operation the voltage on node 133 is approximately equal to the voltage on node 159, so that no current flows through either diodes 152 or 151. In receive mode of operation, however, buffer 175 is disabled and the voltage $V_O$ can swing across the full operating potential. But as soon as the voltage at node 159 deviates from the voltage at node 133 by more than ~0.7 volts, one of the two diodes 151 or 152 will begin to conduct. Thus, potentially destructive reverse breakdown current is shunted away from the output bipolar transistors.

High impedance at node 133 (as seen looking back toward the input) is further preserved by means of a digital-to-analog converter (DAC) comprising a standard binary-weighted string of resistors coupled in parallel to convert a digital representation of the transmit signal into an analog signal at node 111. The DAC resistors are driven by a DAC driver circuit 100 which provides an appropriate voltage to the respective DAC lines, e.g., DAC0-7. Driver 100 also includes circuitry for synchronizing the individual input lines of an 8-bit input digital signal to a clock signal. In a current embodiment, DAC driver 100 comprises part no. XC3042PC84-100 manufacured by XILINX Corporation.

The use of a digitally-controlled input signal is important in the present invention because it provides an additional means of establishing a high receive mode input impedance at node 133. DAC 100 has a thevenin equivalent impedance that represents the parallel combination of all of its resistors. Because the circuit of FIG. 6 is driven digitally, this digital circuitry can be tri-stated to create a high impedance looking back into node 133. Thus, a high output impedance is achieved in the "off" or receive mode of operation by debiasing the emitter follower output stage by means of digital switch 115, and also by tri-stating the digital drive circuitry of DAC 100. At the same time, diodes 151 and 152 perform the dual function of protecting the emitter follower base emitter junctions from reverse breakdown in receive mode while limiting the output current to protect against shorts while in transmit mode. By way of example, if $R_L=0$ (i.e., a short), then buffer 175 would attempt to supply an infinite current at its output —limited only by the available base drive current for transistors 168 and 169 the beta of these transistors and the very low impedance of resistors 160-163. On the other hand, the inclusion of diodes 151 and 152 provides a more properly controlled current limit, wherein the source and sink peak currents through transistors 168 and 169 are limited to approximately 0.7 $V/R_{160}$ and 0.7 $V/R_{163}$, respectively.

In order to prevent transients from appearing at the amplifier's output while switching from transimit to receive modes (or vice-a-versa) the cumulative change on capacitors 102 and 104 is conserved. For example, consider the case where the circuit is switched from a transmit to a receive mode of operation. When operating in transmit mode (and just prior .o switching) node 101 and the line labelled DAC7 are both charged to one-half of the supply potential $V_{DD}$ (e.g., 2.5 V). In receive mode, however, (after switching) resistor 103 pulls the left plate of capacitor 104 up to $V_{DD}$, while the line labelled DAC0 is pulled low. This grounds the left plate of capacitor 102. Thus, the cumulative charge on both capacitors is conserved. (Note that line DAC0 is the only DAC output line which is not tri-stated in receive mode of operation.)

Note that the quiescent current $I_{DQ}$ is selected in the circuit of FIG. 6 such that there is sufficient base drive current available for transistors 168 and 169. In general, resistors 190 and 193 are selected such that the sum of resistors 160-163 ratioed against the sum of resistors 190 and 193 set an appropriate output quiescent current $I_{OQ}$ which achieves low distortion and meets FCC regulations.

Finally, the power line amplifier circuit of FIG. 6 also incorporates a important filter function for maintaining low distortion in the transmit signal. Low distortion and spurious filtering is critical if the power line amplifier is to meet stringent FCC regulations. Accordingly, the embodiment of FIG. 6 includes a Salen Key filter having a circuit configuration which is best illustrated by the schematic of FIG. 7. The Salen Key topology utilizes a unity gain buffer in conjunction with capacitors $C_1$ and $C_2$ and resistors $R_1$ and $R_2$, to provide a wide variety of filter functions. In the present invention, a second order filter is realized having a cut-off frequency point at approximately 400 KHz. This operation is in accordance with the current use of the circuit of FIG. 6 in a spread spectrum communication system operating within the frequency range of approximately 100-400 KHz. A third order Salen key filter can be realized by including the additional elements $R_X$ and $C_X$ as optionally shown in FIG. 7.

Viewing FIGS. 6 and 7 together, it can be seen that capacitor $C_1$ comprises the sum of capacitors 127 and 126, capacitor $C_2$ comprises capacitor 131, and resistor $R_2$ comprises resistor 130. Resistor $R_1$ of FIG. 7 comprises the parallel combination of resistors 109 and the seven other DAC resistors (i.e., R, 2R, 4R, 8R, 16R, 32R and 64R; collectively, $R_{DAC}$) in FIG. 6. Resistors 107 and 108 set the amplifier's bias boltage at one-half the supply voltage $V_{CC}$ so that a balanced plus/minus swing is available.

One of the noteworthy features about the circuit of FIG. 6 is that it combines a second-order filter function with a "tri-stateable" unity gain output buffer wherein both share common components. Obviously, combining these two functions in a single circuit reduces the overall component count. The end result is an amplifier circuit providing a complex filter function while at the same time having the capability to drive large amounts of power onto the power lines at a minimum component cost.

Whereas many alternations and modifications to the present invention will no doubt become apparent to a person of ordinary skill in the art after having read the foregoing description, it is to be understood that the particular embodiments shown and described by way of illustration are in no way intended to be considered limiting. Therefore, reference to the details of these embodiments is not intended to limit the scope of the claims which themselves recite only those features regarded as essential to the invention.

What is claimed is:

1. An amplifier for transmitting a communication signal across a power line comprising:
    a converter means for converting a binary representation of said communication signal into an analog transmit signal;
    a filter means for filtering said transmit signal to reduce frequency components above a predetermined frequency;
    buffer means for transmitting said filter transmit signal onto said power line;
    control means coupled to said buffer means and said converter means for switching from a transmit mode to a receive mode of operation,
    said buffer means and said converter means presenting a relatively high impedance to said power line when in said receive mode.

2. The amplifier of claim 1 wherein said buffer means comprises a unity gain buffer.

3. The amplifier of claim 2 wherein said filter means is integrally coupled to said buffer means.

4. The amplifier of claim 3 wherein said control means comprises a biasing means for providing a source of current to said buffer means.

5. The amplifier of claim 4 wherein said control means further comprises a digitally-controlled switching means for coupling said biasing means to a first operating potential.

6. The amplifier of claim 5 wherein said buffer means is coupled to a second operating potential which is higher than said first operating potential.

7. The amplifier of claim 6 wherein said buffer means comprises at least two pairs of bipolar transistors, each of said pairs including an NPN and a PNP transistor configured as emitter followers.

8. The amplifier of claim 7 wherein said buffer means further comprises protection means for protecting said bipolar transistors from destructive reverse breakdown conditions when operating in said receive mode.

9. The amplifier of claim 8 wherein said protection means comprises at least one diode coupled between an output node and an input node of said buffer means.

10. The amplifier of claim 9 wherein said predetermined frequency is approximately 400 KHz.

11. The amplifier of claim 1 wherein said filter means comprises a second-order Salen key filter.

12. An amplifier for transmitting a communication signal across a power line comprising:
    a digital-to-analog converter (DAC) for converting a binary representation of said communications signal into an analog transmit signal, said DAC having a tri-state mode of operation;
    a filter means for filtering said analog transmit signal;
    unity gain output buffer means for driving said filtered analog transmit signal onto said power line;
    biasing means for providing a source of current to said buffer means;
    control means coupled to said DAC and said biasing means for switching from a transmit mode of operation to a receive mode;
    wherein said DAC operates in said tri-state mode and said source of current is cut-off from said buffer means when said amplifier is switched in said receive mode, said amplifier presenting a high impedance to said power line in said receive mode.

13. The amplifier of claim 12 wherein said filter means is integrally coupled to said buffer means.

14. The amplifier of claim 13 wherein said filter means comprises a second order Salen key filter which eliminates frequency components above a predetermined frequency from said transmit signal.

15. The amplifier of claim 13 wherein said control means further comprises a digital-controlled switching means for coupling said biasing means to a first operating potential.

16. The amplifier of claim 15 wherein said buffer means is coupled to a second operating potential which is higher than said first operating potential.

17. The amplifier of claim 16 wherein said buffer means comprises at least two pairs of bipolar transistors, each of said pairs including an NPN and a PNP transistor configured as emitter followers.

18. The amplifier of claim 17 further comprising protection means for protecting said bipolar transistors from destructive reverse breakdown when operating in said receive mode.

19. The amplifier of claim 18 wherein said protection means comprises at least one diode coupled between an output node and an input node of said buffer means.

20. The amplifier of claim 13 wherein said communications signal comprises a spread spectrum communications signal.

21. The amplifier of claim 20 wherein said filter means filter said transmit signal to eliminate frequency components above a predetermined frequency.

22. The amplifier of claim 21 wherein said predetermined frequency is approximately 400 KHz.

* * * * *

UNITED STATES PATENT AND TRADEMARK OFFICE
CERTIFICATE OF CORRECTION

| | | |
|---|---|---|
| PATENT NO. | : | 5,241,283 |
| DATED | : | August 31, 1993 |
| INVENTOR(S) | : | Philip H. Sutterlin |

It is certified that error appears in the above-identified patent and that said Letters Patent is hereby corrected as shown below:

In column 8 at line 13 delete "millilamps" and insert --milliamps--

In column 8 at line 29 delete "ration" and insert --ratio--

In column 12 at line 32 delete "change" and insert --charge--

Signed and Sealed this

Thirtieth Day of December, 1997

Attest:

BRUCE LEHMAN

Attesting Officer

Commissioner of Patents and Trademarks